(12) United States Patent
Yang et al.

(10) Patent No.: US 8,976,611 B2
(45) Date of Patent: Mar. 10, 2015

(54) ASYMMETRIC SENSING AMPLIFIER, MEMORY DEVICE AND DESIGNING METHOD

(71) Applicants: Jung-Ping Yang, Jui-bei (TW); Chia-En Huang, Xingfeng Township (TW); Fu-An Wu, Hsinchu (TW); Chih-Chieh Chiu, Hsinchu (TW); Cheng Hung Lee, Hsinchu (TW)

(72) Inventors: Jung-Ping Yang, Jui-bei (TW); Chia-En Huang, Xingfeng Township (TW); Fu-An Wu, Hsinchu (TW); Chih-Chieh Chiu, Hsinchu (TW); Cheng Hung Lee, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 64 days.

(21) Appl. No.: 13/837,614

(22) Filed: Mar. 15, 2013

(65) Prior Publication Data

US 2014/0269110 A1    Sep. 18, 2014

(51) Int. Cl.
| | |
|---|---|
| G11C 7/00 | (2006.01) |
| G11C 7/06 | (2006.01) |
| G06F 17/50 | (2006.01) |
| G11C 7/10 | (2006.01) |
| G11C 7/12 | (2006.01) |
| G11C 11/419 | (2006.01) |

(52) U.S. Cl.
CPC ............ *G11C 7/065* (2013.01); *G06F 17/5081* (2013.01); *G11C 7/1048* (2013.01); *G11C 7/12* (2013.01); *G11C 11/419* (2013.01)
USPC .................. 365/205; 365/189.11; 365/185.21

(58) Field of Classification Search
CPC ............ G11C 7/065; G11C 7/12; G11C 7/22; G11C 7/4096
USPC ............... 365/205, 207, 208, 185.21, 185.11, 365/203, 189.11
See application file for complete search history.

(56) References Cited

U.S. PATENT DOCUMENTS

| | | | |
|---|---|---|---|
| 6,127,653 A * | 10/2000 | Samuels | 219/213 |
| 6,462,584 B1 * | 10/2002 | Proebsting | 327/52 |
| 6,473,343 B2 * | 10/2002 | Ohba et al. | 365/189.07 |
| 8,068,369 B2 * | 11/2011 | Kajigaya | 365/185.21 |

* cited by examiner

*Primary Examiner* — Gene Auduong
(74) *Attorney, Agent, or Firm* — Lowe Hauptman & Ham, LLP (57) ABSTRACT

A sensing amplifier for a memory device includes first and second nodes, an input device and an output device. The memory device includes first and second bit lines, and at least one memory cell coupled to the bit lines. The first and second nodes are coupled to the first and second bit lines, respectively. The input device is coupled to the first and second nodes and generates a first current pulling the first node toward a predetermined voltage in response to a first datum read out from the memory cell, and to generate a second current pulling the second node toward the predetermined voltage in response to a second datum read out from the memory cell. The output device is coupled to the first node to output the first or second datum read out from the memory cell. The first current is greater than the second current.

20 Claims, 6 Drawing Sheets

ASYMMETRIC SENSING AMPLIFIER, MEMORY DEVICE AND DESIGNING METHOD

BACKGROUND

Processors and memories are various parts of computing systems and electronic devices. The performance of a memory impacts the overall performance of the system or electronic device. Various circuits are developed to improve one or more aspects of memory performance, such as capacity, access speed, power consumption, compact layout etc.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

It is to be understood that the following disclosure provides many different embodiments or examples, for implementing different features of various embodiments. Specific examples of components and arrangements are described below to simplify the present disclosure. The inventive concept may, however, be embodied in many different forms and should not be construed as being limited to the embodiments set forth herein; rather, these embodiments are provided so that this description will be thorough and complete, and will fully convey the inventive concept to those of ordinary skill in the art. It will be apparent, however, that one or more embodiments may be practiced without these specific details.

In some embodiments, an asymmetric sensing amplifier has an output device coupled to a first bit line in a pair of bit lines. The pair of bit lines further includes a second bit line. The asymmetric sensing amplifier pulls the first bit line toward a predetermined voltage with a first current greater than a second current with which the asymmetric sensing amplifier pulls the second bit line toward the predetermined voltage. As a result, an effect associated with a parasitic capacitance of the output device coupled to the first bit line is compensated for by the greater first current. In one or more embodiments, a ratio of the first and second currents is matched with a ratio of total capacitance loadings of the corresponding first and second bit lines. As a result, logical "0" and logical "1" read speeds are balanced which, in turn, results in an improved overall read speed. Compared to other approaches where a dummy device and/or a dummy metal is coupled to the second bit line for symmetry, the asymmetric sensing amplifier in one or more embodiments does not include such dummy device and dummy metal, and therefore, is more compact in layout area and exhibits an improved read margin due to the reduced total capacitance loading.

Figure 1:
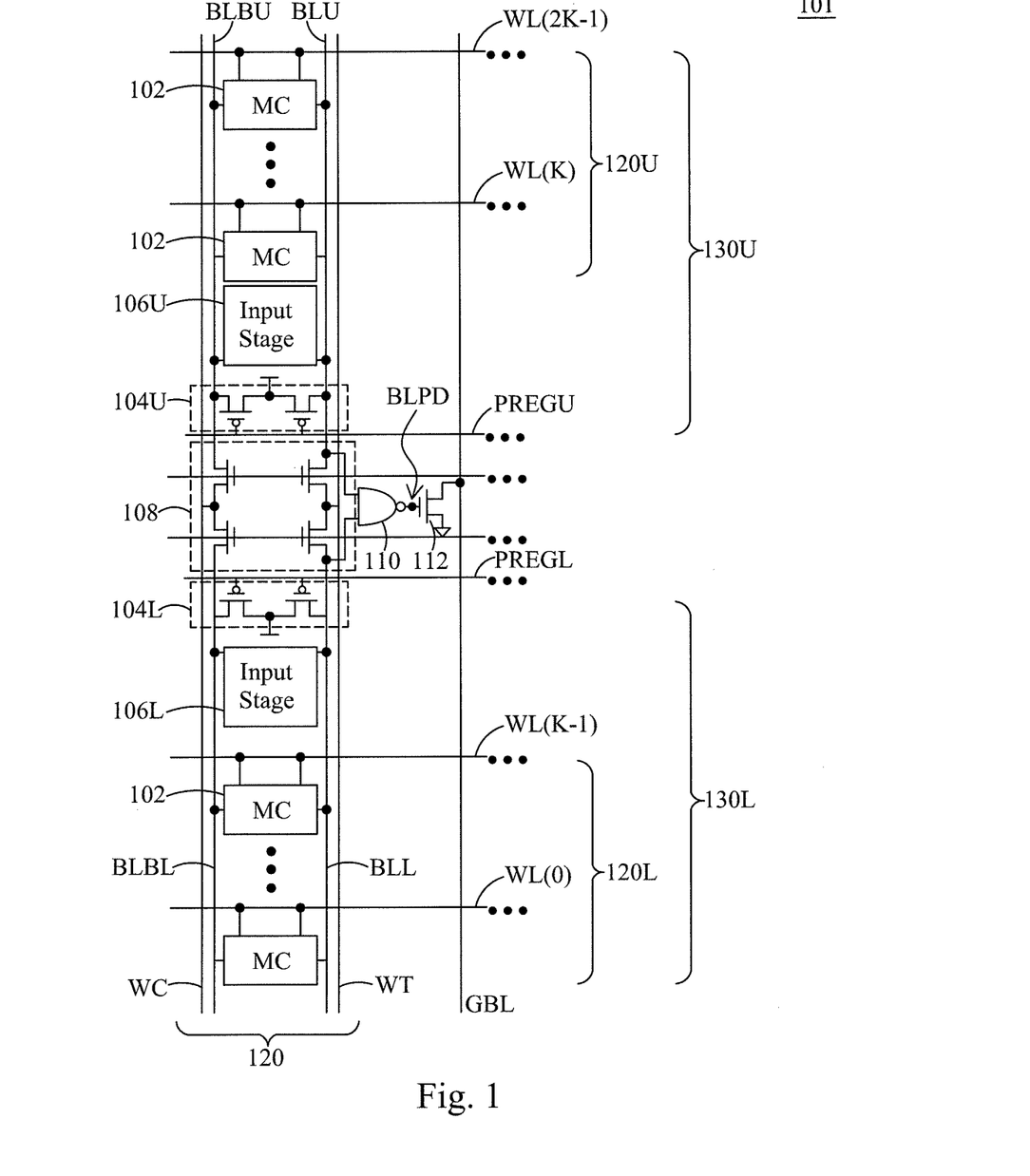
FIG. 1 is a schematic circuit diagram of a segment of a memory device in accordance with some embodiments.

FIG. 1 is a schematic circuit diagram of a segment of a memory device 101 in accordance with some embodiments. The memory device 101 includes one or more memory cells (MC) 102, one or more pairs of bit lines BLU/BLBU, BLL/BLBL, and one or more global bit lines GBL. One or more memory cells 102 are coupled to each pair of bit lines to form one or more memory blocks. Specifically, multiple memory cells 102 are coupled to the pair of bit lines BLU/BLBU to form an upper half 120U of a memory block 120, whereas multiple memory cells 102 are coupled to the pair of bit lines BLL/BLBL to form a lower half 120L of the memory block 120. One or more memory blocks is coupled to a global bit line. Specifically, the memory block 120 is coupled to the global bit line GBL. The memory device 101 further includes a plurality of word lines WL(0)-WL(2k−1) (where k is an integer) coupled to the memory cells 102. The memory device 101 has a lower half 130L and an upper half 130U. In the lower half 130L, the memory cells 102 are coupled to one half of the word lines, i.e., the word lines WL(0)-WL(k−1). In the upper half 130U, the memory cells 102 are coupled to the other half of the word lines, i.e., the word lines WL(k)-WL(2k−1). In FIG. 1, WT and WC denote a pair of write data lines associated with each memory block 120.

Each memory block 120 further includes bit line pre-charging circuits 104U, 104L, and input devices (or input stages) 106U, 106L, in the corresponding upper and lower halves 130U, 130L, of the memory device 101. The memory block 120 further includes a write pass gate circuit 108, an output device 110, and a pull-down circuit 112 all of which are common for both the upper and lower halves 130U, 130L. The output device 110 and the input devices 106U, 106L, define a sensing amplifier which is connected to the bit lines BLU and BLL and configured to detect a state of the bit lines BLU and BLL in a single-ended sensing scheme (i.e., one bit line BLU, rather than both bit lines BLU/BLBU, is used for the sensing operation).

In this example, the output device 110 is implemented as a NAND gate, although other configurations are also within the scope of various embodiments. The bit line pre-charging circuits 104U, 104L are similarly configured. In one or more embodiments, each of the bit line pre-charging circuits 104U, 104L, includes two p-channel metal-oxide semiconductor (PMOS) transistors which are turned ON of OFF by a common pre-charging signal PREGU, PREGL. The input devices 106U, 106L are similarly configured. Each memory block 120 in particular and the memory device 101 in general have a symmetrical structure in some embodiments. In some embodiments, the memory device 101 does not have a symmetrical structure. For example, in some embodiments, the lower half of the memory device 101, including the word lines WL(0)~WL(k−1), the associated memory cells 102, the bit line pre-charging circuit 104L and the input device 106L, is omitted. For simplicity, the following description is given for the upper half 130U of the memory device 101. In embodiments where the memory device 101 also includes the lower half 130L, the following description similarly applies to the lower half 130L.

For read and/or write operations, the bit line pre-charging circuit 104U is configured to pre-charge the corresponding pair of bit lines BLU/BLBU, and the input device 106U is configured to pull the pre-charged bit lines toward a predetermined voltage. The predetermined voltage is a ground voltage in a pull-down arrangement in which the bit lines are pulled down toward the ground voltage. In some embodiments, the predetermined voltage is a power supply voltage in a pull-up arrangement in which the bit lines are pulled up toward the power supply voltage. In some embodiments, the predetermined voltage is a voltage between the ground voltage and the power supply voltage, or another voltage level depending on applications and/or other considerations. The write pass gate circuit 108 is configured to enable or disable writing to the memory cells 102 in the memory block 120.

In some embodiments, when a logical "0" is read from a memory cell 102 in the memory block 120, the first bit line (e.g., BLU) in the corresponding pair of bit lines is pulled down toward the ground voltage, whereas the second bit line (e.g., BLBU) in the corresponding pair of bit lines is pulled up toward (or stays at) the power supply voltage. The pulled-down voltage on the first bit line BLU causes the output device 110 to output, at a node BLPD, a high voltage to the pull-down circuit 112 which, in turn, is turned ON to pull the global bit line GBL toward the ground voltage. When a logical "1" is read from a memory cell 102 in the memory block 120, the second bit line BLBU is pulled down toward the ground voltage, whereas the first bit line BLU is pulled up toward (or stays at) the power supply voltage. The pulled-up voltage on the first bit line BLU causes the output device 110 to output, at the node BLPD, a low voltage to the pull-down circuit 112 which, in turn, is turned OFF and leaves the global bit line GBL at a global bit line pre-charge voltage. The voltage on the global bit line GBL indicates the datum read out from the memory cell 102.

The overall memory read speed depends on several factors including, but not limited to, how fast the input device 106U pulls the corresponding bit lines BLU, BLBU toward a predetermined voltage, e.g., the ground voltage or the power supply voltage. The overall memory read speed is also improved when logical "0" and logical "1" read speeds are balanced. In particular, the closer a pulling strength with which the input device 106U pulls the first bit line BLU (when reading a logical "0") is to a pulling strength with which the input device 106U pulls the second bit line BLBU (when reading a logical "1"), the faster the overall memory read speed becomes. The coupling of the output device 110 to the first bit line BLU creates an asymmetry that affects, in some situations, the balancing of the pulling strengths of the input device 106U on the first bit line BLU and on the second bit line BLBU.

Figure 2:
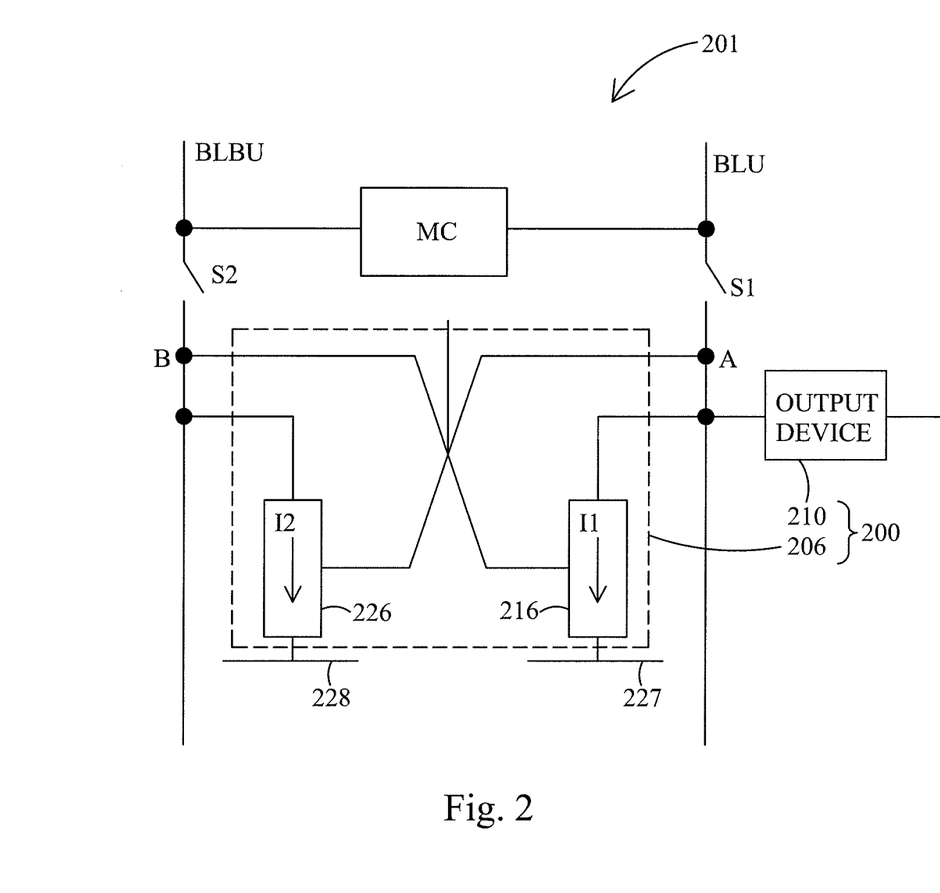
FIG. 2 is a schematic block diagram of an asymmetric sensing amplifier for a memory device in accordance with some embodiments.

FIG. 2 is a schematic block diagram of an asymmetric sensing amplifier 200 for a memory device 201 in accordance with some embodiments. The memory device 201 comprises a first bit line BLU, a second bit line BLBU, and at least one memory cell MC coupled to the first bit line BLU and the second bit line BLBU. In some embodiments, the memory device 201 corresponds to the memory device 101, the first and second bit lines BLU, BLBU, correspond to one pair of bit lines (e.g., BLU and BLBU), and the at least one memory cell MC corresponds to a memory cell 102, as described with respect to FIG. 1.

The sensing amplifier 200 comprises a first node A configured to be coupled to the first bit line BLU via a first switch S1, and a second node B configured to be coupled to the second bit line BLBU via a second switch S2. The first switch S1 and the second switch S2 are configured to connect the corresponding first bit line BLU and second bit line BLBU to the sensing amplifier 200 when a memory cell MC connected to the first bit line BLU and the second bit line BLBU is accessed in a read operation. The first switch S1 and the second switch S2 are configured to disconnect the corresponding first bit line BLU and second bit line BLBU from the sensing amplifier 200 when no memory cell MC connected to the first bit line BLU and the second bit line BLBU is accessed in a read operation. In some embodiments, the switches S1 and S2 are transistors, such as PMOS transistors, although other switch configurations are within the scope of various embodiments. In some embodiments, the switches S1 and S2 are omitted.

The sensing amplifier 200 further comprises an input device 206 and an output device 210. The input device 206 is coupled to the first node A and the second node B. The output device 210 is coupled to the first node A. The input device 206 is configured to detect a datum read out from the at least one memory cell MC of the memory device 201, and the output device 210 is configured to output the datum read out from the memory cell MC. In some embodiments, the input device 206 corresponds to the input device 106U or 106L, the output device 210 corresponds to the output device 110, and the sensing amplifier 200 corresponds to the sensing amplifier described with respect to FIG. 1.

The input device 206 includes a first circuit 216 and a second circuit 226. Each of the first circuit 216 and the second circuit 226 is connected to both the first node A and the second node B. The first circuit 216 is configured to generate a first current I1 pulling the first node A toward a predetermined voltage on a node 227 in response to a first datum read out from the memory cell MC. The second circuit 226 is configured to generate a second current I2 pulling the second node B toward a predetermined voltage on a node 228 in response to a second datum read out from the memory cell MC. In some embodiments, the predetermined voltages on the nodes 227 and 228 are equal. In some embodiments, the predetermined voltages on the nodes 227 and 228 are different. In one or more embodiments, the predetermined voltage on the nodes 227 and 228 is the ground voltage. Other levels of the predetermined voltages at nodes 227, 228 are within the scope of various embodiments.

More specifically, when the first datum, e.g., a logical "0," is read out from the memory cell MC, the first bit line BLU is pulled down toward the ground voltage, whereas the second bit line BLBU is pulled up toward (or stays at) a power supply voltage. As a result, the first node A coupled to the first bit line BLU is pulled down toward the ground voltage and disables the second circuit 226, whereas the second node B coupled to the second bit line BLBU is pulled up toward (or stays at) the power supply voltage and enables the first circuit 216. The enabled first circuit 216 pulls the first node A towards the ground voltage with the first current I1. The output device 210 generates an output corresponding to a low voltage of the first node A, which is pulled down, indicating the logical "0" being read out. Similarly, when the second datum, e.g., a logical "1," is read out from the memory cell MC, the second bit line BLBU is pulled down toward the ground voltage, whereas the first bit line BLU is pulled up toward (or stays at) the power supply voltage. As a result, the first node A coupled to the first bit line BLU is pulled up toward (or stays at) the power supply voltage and enables the second circuit 226, whereas the second node B coupled to the second bit line BLBU is pulled down toward the ground voltage and disables the first circuit 216. The enabled second circuit 226 pulls the second node B towards the ground voltage with the second current I2. The output device 210 generates an output corresponding to a high voltage of the first node A, which is pulled up or stays at the power supply voltage, indicating the logical "1" being read out.

As noted herein, the coupling of the output device 210 to the first bit line BLU via the first node A creates an asymmetry that affects, in some situations, the balancing of pulling strengths of the input device 206 on the first bit line BLU (via the first node A) and on the second bit line BLBU (via the second node B). Specifically, pulling strengths of the input device 206 on the first node A and on the second node B depend on corresponding total capacitance loadings of the first node A and the second node B. In some embodiments, the total capacitance loading of the first node A is a sum of parasitic capacitances of components coupled to the first node A. For example, the total capacitance loading of the first node A is a sum of a parasitic capacitance of the at least one memory cell MC, parasitic capacitances of elements of the first circuit 216 and second circuit 226 that are coupled to the first node A, and a parasitic capacitance of the output device 210. Similarly, the total capacitance loading of the second node B, in some embodiments, is a sum of parasitic capacitances of components coupled to the second node B, e.g., the parasitic capacitance of the at least one memory cell MC, and parasitic capacitances of elements of the first circuit 216 and second circuit 226 that are coupled to the second node B. The output device 210 is not directly connected to the second node B and, therefore, the total capacitance loading of the second node B does not include the parasitic capacitance of the output device 210. As a result, the total capacitance loading of the first node A, in one or more embodiments, is greater than the total capacitance loading of the second node B, which makes it harder for the input device 206 to pull the first node A than the second node B toward the ground voltage.

In some embodiments, to compensate for the greater total capacitance loading of the first node A compared to the total capacitance loading of the second node B, at least one of the first circuit 216 or the second circuit 226 is configured to have the first current I1 greater than the second current I2. The input device 206 is configured to pull the first node A, which has a greater total capacitance loading, with a greater current. As a result, it is possible, in one or more embodiments, to cause the pulling strength with which the input device 206 pulls the first node A when reading a logical "0" to approach the pulling strength with which the input device 206 pulls the second node B when reading a logical "1", thereby improving the overall memory read speed.

In some embodiments, a ratio I1/I2 of the first current I1 to the second current I2 is matched with a ratio $C_{BL,total}/C_{BLB,total}$ of the total capacitance loading $C_{BL,total}$ of the first node A to the total capacitance loading $C_{BLB,total}$ of the second node B. In one or more embodiments, the input device 206 is designed to have I1/I2 equal to $C_{BL,total}/C_{BLB,total}$. In one or more embodiments, due to one or more variations including, but not limited to, variations in manufacturing process, operation voltage and/or operation temperature (PVT variations), it is possible that the actual ratios I1/I2 and $C_{BL,total}/C_{BLB,total}$ are close, but not necessarily equal to each other. In such situations, the ratio I1/I2 is still considered matched with the ratio $C_{BL,total}/C_{BLB,total}$.

In some embodiments, the sensing amplifier 200 is free of a dummy output device and/or a dummy conductive pattern coupled to the second node B. Compared to other approaches where a dummy device and/or a dummy metal is coupled to the second bit line BLBU for balancing the total capacitance loading of the second storage node B with the total capacitance loading of the first node A, a layout area of the sensing amplifier 200 in one or more embodiments is more compact, because such dummy output device and/or dummy conductive pattern are not included. The absence of dummy output device and/or dummy conductive pattern further reduces the total capacitance loading of the second node B, resulting in a faster logical "1" read speed compared to the other approaches. In one or more embodiments, the sensing amplifier 200 has the first current I1 greater than the second current I2 to cause the logical "0" read speed to approach the logical "1" read speed, which results in a faster overall memory read speed and a better read margin compared to the other approaches.

Figure 3:
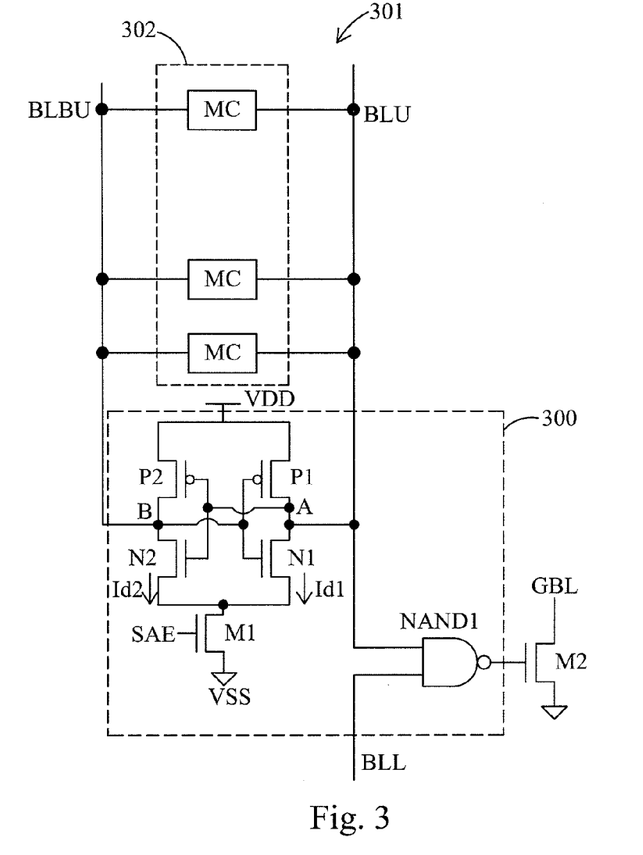
FIG. 3 is a schematic circuit diagram of an asymmetric sensing amplifier for a memory device in accordance with some embodiments.

FIG. 3 is a schematic block diagram of an asymmetric sensing amplifier 300 for a memory device 301 in accordance with some embodiments. The memory device 301 comprises a first bit line BLU, a second bit line BLBU, and a plurality of memory cells MC coupled to the first bit line BLU and the second bit line BLBU. The memory cells MC define a memory array 302. In some embodiments, the memory device 301 corresponds to the memory device 101 or 201 as described with respect to FIG. 1 or 2.

The sensing amplifier 300 comprises a first node A, a second node B, a power supply voltage node VDD and a reference or ground node VSS. In some embodiments, the first node A and the second node B are coupled to the corresponding first bit line BLU and second bit line BLBU via switches as described with respect to FIG. 2. The sensing amplifier 300 further comprises a first transistor N1, a second transistor N2, a third transistor P1, a fourth transistor P2, a fifth transistor M1, and an output device NAND1 which is a NAND gate. In some embodiments, the first transistor N1, second transistor N2, third transistor P1, fourth transistor P2, and fifth transistor M1 together define an input device corresponding to the input device 106U, 106L or 206 as described with respect to FIG. 1 or 2. In some embodiments, the output device NAND1 corresponds to the output device 110 or 210 as described with respect to FIG. 1 or 2. The output device NAND1 has a first input coupled to the first bit line BLU and the first node A. The output device NAND1 has a second input coupled to another bit line BLL. The bit line BLL is at a lower half of the memory device 301 and corresponds to the first bit line BLU as described with respect to FIG. 1. The bit line BLL is coupled to another input device corresponding to the input device 106L described with respect to FIG. 1. A sixth transistor M2 is coupled between an output of the output device NAND1 and a global bit line GBL. The sixth transistor M2 corresponds to the pull-down circuit 112 described with respect to FIG. 1. In one or more embodiments, the first transistor N1, second transistor N2, fifth transistor M1 and sixth transistor M2 are n-channel metal-oxide semiconductor (NMOS) transistors, whereas the third transistor P1 and fourth transistor P2 are PMOS transistors. Other configurations are within the scope of various embodiments.

The first transistor N1 and the third transistor P1 are coupled in series between the power supply voltage node VDD and the reference node VSS. Specifically, a source of the first transistor N1 is coupled to the reference node VSS via the fifth transistor M1, a drain of the first transistor N1 is coupled to a drain of the third transistor P1 at the first node A, and a source of the third transistor P1 is coupled to the power supply voltage node VDD. The second transistor N2 and the fourth transistor P2 are coupled in series between the power supply voltage node VDD and the reference node VSS. Specifically, a source of the second transistor N2 is coupled to the reference node VSS via the fifth transistor M1, a drain of the second transistor N2 is coupled to a drain of the fourth transistor P2 at the second node B, and a source of the fourth transistor P2 is coupled to the power supply voltage node VDD. The first node A is coupled to gates of the second transistor N2 and fourth transistor P2, and to the output device NAND1. The second node B is coupled to gates of the first transistor N1 and third transistor P1. The fifth transistor M1 has a drain coupled to the sources of the first transistor N1 and second transistor N2, and a source coupled to the reference node VSS. The fifth transistor M1 is controlled to turn ON or OFF by a sensing amplifier enabling signal SAE. The first transistor N1, second transistor N2, third transistor P1 and fourth transistor P2 define a cross-coupled latch having complementary logic states at the first node A and second node B. Other sensing amplifier configurations are within the scope of various embodiments.

In a read operation, the first bit line BLU and second bit line BLBU are pre-charged, and one memory cell MC in the memory array 302 is selected or accessed by a corresponding word line as described with respect to FIG. 1. Depending on the datum stored in the accessed memory cell MC, a voltage difference is developed across the first bit line BLU and second bit line BLBU. The voltage difference is applied to the first node A and the second node B, and causes the cross-coupled latch to reach one of two stable states when the sensing amplifier 300 is enabled by turning ON the fifth transistor M1 with the enabling signal SAE.

Specifically, when reading a logical "0," the voltage at the first node A is pulled down whereas the voltage at the second node B is pull up or stays at the power supply voltage, as described with respect to FIG. 2. As a result, the first transistor N1 and fourth transistor P2 are turned ON, and the second transistor N2 and third transistor P1 are turned OFF. A first current Id1 flows from the first node A, via the turned ON first transistor N1 and the turned ON fifth transistor M1 to the reference node VSS. The first node A is pulled down toward the ground voltage by the first current Id1. The first current Id1 is defined by a drain current of the first transistor N1 and corresponds to the first current I1 described with respect to FIG. 2. The stronger the first node A is pulled down by the first current Id1, the faster the cross-coupled latch reaches a first stable state with a logical "0" at the first node A and a logical "1" at the second node B.

When reading a logical "1," the voltage at the first node A is pulled up or stays at the power supply voltage whereas the voltage at the second node B is pull down, as described with respect to FIG. 2. As a result, the first transistor N1 and fourth transistor P2 are turned OFF, and the second transistor N2 and third transistor P1 are turned ON. A second current Id2 flows from the second node B, via the turned ON second transistor N2 and the turned ON fifth transistor M1 to the reference node VSS. The second node B is pulled down toward the ground voltage by the second current Id2. The second current Id2 is defined by a drain current of the second transistor N2 and corresponds to the second current I2 described with respect to FIG. 2. The stronger the second node B is pulled down by the second current Id2, the faster the cross-coupled latch reaches a second stable state with a logical "1" at the first node A and a logical "0" at the second node B.

The speeds at which the cross-coupled latch reaches the first and second stable states are balanced by configuring at least one of the first transistor N1 or second transistor N2 to approach a ratio Id1/Id2 to a ratio $C_{BL,total}/C_{BLB,total}$ of a total capacitance loading $C_{BL,total}$ of the first node A to a total capacitance loading $C_{BLB,total}$ of the second node B. The total capacitance loading $C_{BL,total}$ of the first node A is a sum of parasitic capacitances of components coupled to the first node A. The total capacitance loading $C_{BLB,total}$ of the second node B is a sum of parasitic capacitances of components coupled to the second node B. In some embodiments, the total capacitance loadings $C_{BL,total}$ and $C_{BLB,total}$ are determined as follows:

$$C_{BL,total} = C_{array,total} + C_{(N1+P1),drain} + C_{(N2+P2),gate} + C_{nand,gate} \quad (1)$$

$$C_{BLB,total} = C_{array,total} + C_{(N2+P2),drain} + C_{(N1+P1),gate} \quad (2)$$

where $C_{array,total}$ is a sum of parasitic capacitances of the memory cells MC in the memory array 302, $C_{(N1+P1),drain}$ is a parasitic capacitance of the drains of the first transistor N1 and third transistor P1, $C_{(N2+P2),gate}$ is a parasitic capacitance of the gates of the second transistor N2 and fourth transistor P2, $C_{nand,gate}$ is a parasitic capacitance of the output device NAND1, $C_{(N2+P2),drain}$ is a parasitic capacitance of the drains of the second transistor N2 and fourth transistor P2, and $C_{(N1+P1),gate}$ is a parasitic capacitance of the gates of the first transistor N1 and third transistor P1.

The drain current of the first transistor N1 or second transistor N2 is determined as follows:

$$Id = K'n/2 * W/L * (V_{GS} - V_T)^2 * (1 + \lambda * V_{DS}) \quad (3)$$

where $K'n = \mu_n C_{ox}$, Id is the drain current, $\mu_n$ is the mobility of a charge carrier in the transistor, Cox is the capacitance of a gate oxide of the transistor, W is a channel width of the transistor, L is a channel length of the transistor, $V_{GS}$ is a gate-source voltage of the transistor, $V_T$ is the threshold voltage of the transistor, $V_{DS}$ is a drain-source voltage, and $\lambda$ is a channel-length modulation parameter. By modifying any one or more of the components in Equation (3), the drain current(s) of any one or both of the first transistor N1 and second transistor N2 is/are configured to approach the ratio Id1/Id2 to the ratio $C_{BL,total}/C_{BLB,total}$.

$C_{BL,total}$ is greater than $C_{BLB,total}$ because $C_{nand,gate}$ is included in $C_{BL,total}$ but not in $C_{BLB,total}$. In other words, $C_{BL,total}/C_{BLB,total}$ is greater than 1. In some embodiments, the ratio Id1/Id2 is approached to the ratio $C_{BL,total}/C_{BLB,total}$ by configuring at least one of the first transistor N1 or second transistor N2 to have Id1 greater than Id2. In some embodiments, the relationship Id1 greater than Id2 is achieved by configuring the first transistor N1 to be larger in size than the second transistor N2.

In some embodiments, by modifying any one or more of the components in Equation (3), the drain current(s) of any one or both of the first transistor N1 and second transistor N2 is/are configured to match the ratio Id1/Id2 to the ratio $C_{BL,total}/C_{BLB,total}$, i.e., to achieve $$Id1/Id2 = C_{BL,total}/C_{BLB,total} \quad (4)$$

In one or more embodiments, the first transistor N1 and second transistor N2 are configured similarly, except for the channel width to channel length ratio W/L. In such embodiments, the ratio Id1/Id2 is matched to the ratio $C_{BL,total}/C_{BLB,total}$ as follows:

$$(W/L)_{N1}/(W/L)_{N2} = C_{BL,total}/C_{BLB,total} \quad (5)$$

where $(W/L)_{N1}$ is the channel width to channel length ratio of the first transistor N1, and $(W/L)_{N2}$ is the channel width to channel length ratio of the second transistor N2. As discussed herein, although the sensing amplifier 300 in one or more embodiments is designed to achieve the relationship defined in Equation (4), due to one or more variations, such as PVT variations, it is possible that the actual ratios Id1/Id2 and $C_{BL,total}/C_{BLB,total}$ are close, but not necessarily equal to each other. In such situations, the ratio Id1/Id2 is still considered matched with the ratio $C_{BL,total}/C_{BLB,total}$.

One or more effects described with respect to the sensing amplifier 200, such as compact layout area, improved read speed and read margin, is/are also obtainable in the sensing amplifier 300 in accordance with some embodiments. Further simulation results indicate that, with no dummy output device or dummy conductive pattern connected to the second node B, the sensing amplifier in accordance with some embodiments achieves equal or better mismatch and/or offset voltage performances compared to other approaches that connect a dummy output device and/or a dummy conductive pattern to the second node B for symmetry. The sensing amplifier in accordance with some embodiments achieves an overall read speed improvement of about 15% over the other approaches. The read time distribution of the sensing amplifier in accordance with some embodiments is also tighter than in the other approaches, achieving an improvement of about 60%. The sensing amplifier in accordance with some embodiments further achieves a low voltage performance at least equal to the other approaches, and is capable to operate at lower than 80% of nominal operational voltage (0.8*Vdd).

Figure 4:
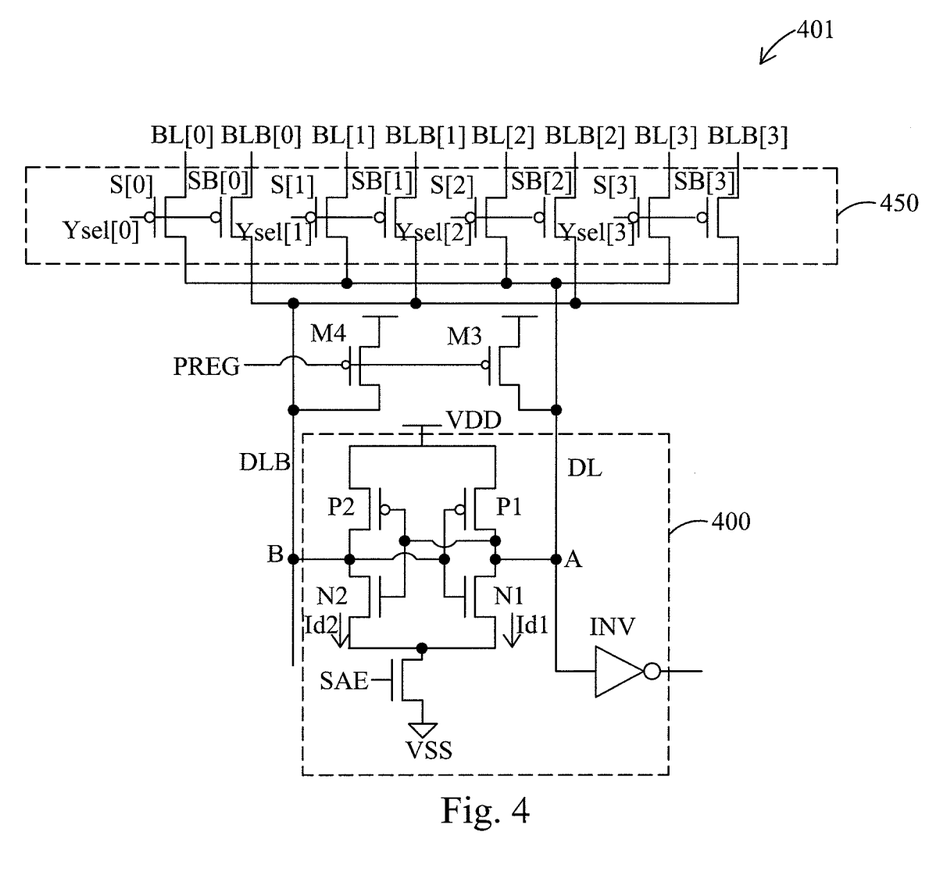
FIG. 4 is a schematic circuit diagram of an asymmetric sensing amplifier for a memory device in accordance with some embodiments.

FIG. 4 is a schematic block diagram of an asymmetric sensing amplifier 400 for a memory device 401 in accordance with some embodiments. The memory device 401 comprises a plurality of pairs of bit lines. Four pairs of bit lines BL[0]/BLB[0], BL[1]/BLB[1], BL[2]/BLB[2], and BL[3]/BLB[3] are shown in FIG. 4 for illustrative purposes. Other numbers of bit lines are within the scope of various embodiments. Each pair of bit lines is coupled to multiple memory cells similarly to the first and second bit lines BLU/BLBU coupled to the memory array 302. The sensing amplifier 400 is similar to the sensing amplifier 300, except that the output device NAND1 in the sensing amplifier 300 is replaced with an output device INV, which is an inverter. The sensing amplifier 400 is coupled to the pairs of bit lines BL[0]/BLB[0]~BL[3]/BLB[3] via a column selector 450, and a pair of data lines including a first data line DL and a second data line DLB. The first data line DL is coupled to the first node A, and the second data line DLB is coupled to the second node B.

The column selector 450 includes a plurality of pair of switches. Four pairs of switches S[0]/SB[0], S[1]/SB[1], S[2]/SB[2], and S[3]/SB[3] are shown in FIG. 4 for illustrative purposes. Other numbers of switches are within the scope of various embodiments. Each pair of switches of the column selector 450 includes a first switch S[0]~S[3] coupled between the first data line DL and the corresponding first bit line BL[0]~BL[3], and a second switch SB[0]~SB[3] coupled between the second data line DLB and the corresponding second bit line BLB[0]~BLB[3]. The first and second switches in each pair of switches S[0]/SB[0]~S[3]/SB[3] are configured to be turned ON or OFF by a common column select signal Ysel[0]~Ysel[3]. When a memory cell of the memory device 401 is accessed in a read operation, the corresponding pair of bit lines BL[0]/BLB[0]~BL[3]/BLB[3] is coupled to the pair of data lines DL/DLB by turning ON the corresponding pair of switches S[0]/SB[0]~S[3]/SB[3]. In some embodiments, the switches S[0]/SB[0]~S[3]/SB[3] are PMOS transistors. Other configurations for the column selector 450 are within the scope of various embodiments Two PMOS transistors M3 and M4 are coupled to the corresponding first data line DL and second data line DLB. The PMOS transistors M3 and M4 define a pre-charging circuit corresponding to the pre-charging circuit 104U or 104L described with respect to FIG. 1. The PMOS transistors M3 and M4 are turned ON or OFF by a common pre-charging signal PREG corresponding to the pre-charging signal PREGU, PREGL described with respect to FIG. 1.

The operation of the sensing amplifier 400 is similar to the operation of the sensing amplifier 300. Specifically, one pair of bit lines BL[0]/BLB[0]~BL[3]/BLB[3] is selected by the column selector 450 to be coupled to the sensing amplifier 400 at a time. A memory cell in the memory array coupled to the selected pair of bit lines is accessed via the corresponding word line. The first node A and second node B are pulled up or down depending on the datum read out from the accessed memory cell.

The ratio Id1/Id2 of the sensing amplifier 400 is configured to approach the ratio $C_{(BL,total+DL,total)}/C_{(BLB,total+DLB,total)}$ of the total capacitance loading $C_{(BL,total+DLB,total)}$ of the first node A to the total capacitance loading $C_{(BLB,total+DLB,total)}$ of the second node B. The total capacitance loading $C_{(BL,total+DLB,total)}$ of the first node A is a sum of (a) parasitic capacitances of one or more memory cells coupled via one of the first bit lines BL[0]~BL[3] and the column selector 450 to the first data line DL and (b) parasitic capacitances of components of the sensing amplifier 400 coupled to the first data line DL. The total capacitance loading $C_{(BLB,total+DLB,total)}$ of the second node B is a sum of (a) parasitic capacitances of one or more memory cells coupled via one of the second bit lines BLB[0]~BLB[3] and the column selector 450 to the second data line DLB and (b) parasitic capacitances of components of the sensing amplifier 400 coupled to the second data line DLB. In some embodiments, the memory arrays coupled to the pairs of bit lines BL[0]/BLB[0]~BL[3]/BLB[3] are identical, and $C_{(BL,total+DL,total)}$ and $C_{(BLB,total+DLB,total)}$ are determined by the Equations (1) and (2), where $C_{array,total}$ is a sum of the memory cells capacitance in one memory array coupled to one pair of bit lines BL[0]/BLB[0]~BL[3]/BLB[3], and $C_{nand,gate}$ is replaced with a gate capacitance of the output device INV. In some embodiments, the ratio Id1/Id2 of the sensing amplifier 400 is matched to the ratio $C_{(BL,total+DL,total)}/C_{(BLB,total+DLB,total)}$. One or more effects described with respect to the sensing amplifier 300 is/are obtainable in the sensing amplifier 400 in accordance with some embodiments.

Figure 5:
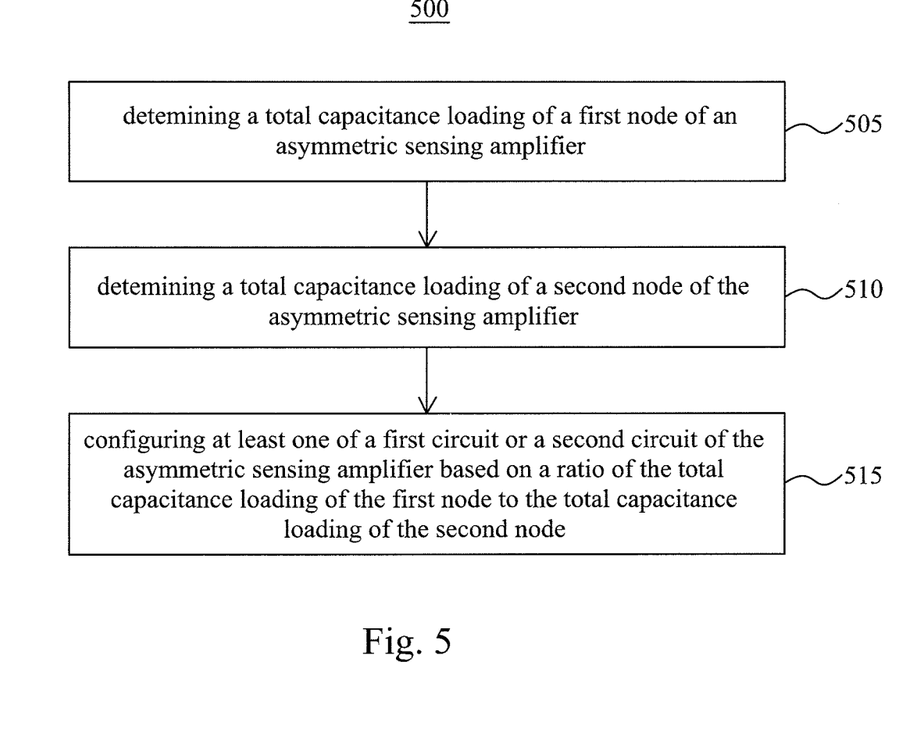
FIG. 5 is a flow chart of a method of designing a memory device in accordance with some embodiments.

FIG. 5 is a flow chart of a method 500 of designing a memory device in accordance with some embodiments. In some embodiments, the memory device to be designed by the method 500 corresponds to the memory device 101, memory device 201, memory device 301 or memory device 401 described herein. An example of designing the memory device 201 by the method 500 in accordance with some embodiments will be described in the following description. The memory device 101, 301 or 401 is designed in a similar manner by the method 500 in accordance with some embodiments.

At operation 505, a total capacitance loading of a first node A of an asymmetric sensing amplifier 200 of the memory device 201 is determined. As described herein, in some embodiments, the total capacitance loading of the first node A is a sum of parasitic capacitances of components coupled to the first node A. In a specific example, the total capacitance loading of the first node A is determined by Equation (1).

At operation 510, a total capacitance loading of a second node B of the asymmetric sensing amplifier 200 of the memory device 201 is determined. As described herein, in some embodiments, the total capacitance loading of the second node B is a sum of parasitic capacitances of components coupled to the second node B. In at least one specific example, the total capacitance loading of the second node B is determined by Equation (2).

At operation 515, at least one of a first circuit 216 or a second circuit 226 of the asymmetric sensing amplifier 200 is configured, based on a ratio of the determined total capacitance loading of the first node A to the determined total capacitance loading of the second node B. In one or more embodiments, the first circuit 216 and/or the second circuit 226 is/are configured to have a first current I1 with which the first circuit 216 pulls the first node A toward a predetermined voltage in response to a first datum (e.g., a logical "0") read out from a memory cell greater than a second current I2 with which the second circuit 226 pulls the second node B toward the predetermined voltage in response to a second datum (e.g., a logical "1") read out from the memory cell. In one or more embodiments, the first current I1 is defined by a drain current of a first transistor in the first circuit 216, the second current I2 is defined by a drain current of a second transistor in the second circuit 226, and the first transistor is larger in size than the second transistor. In at least one embodiment, the first transistor has a greater channel width to channel length ratio than the second transistor. In some embodiments, the ratio I1/I2 is matched with the ratio of the total capacitance loading of the first node A to the total capacitance loading of the second node B. In at least one specific example, the matching is achieved in accordance with Equation (4) and/or Equation (5).

Figure 6:
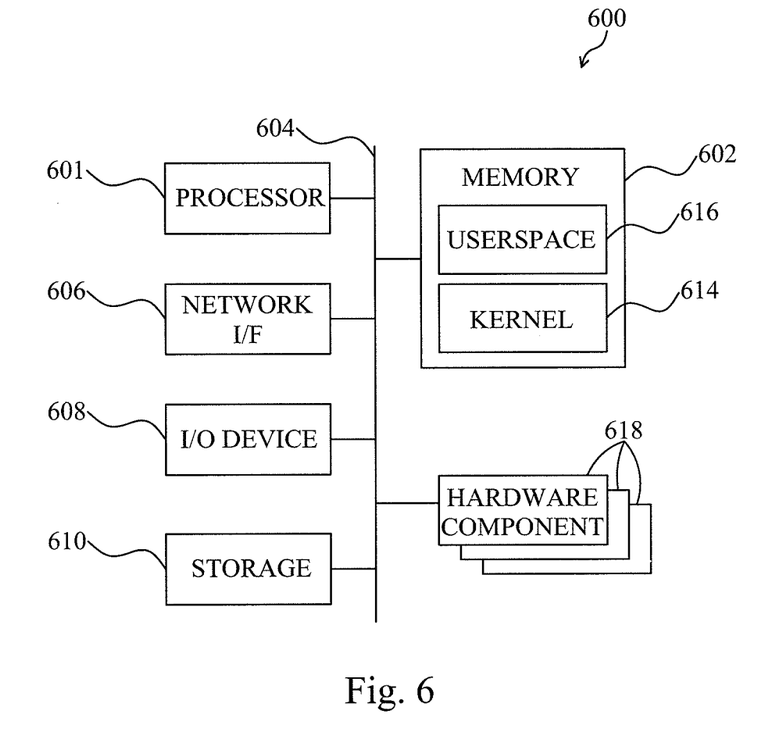
FIG. 6 is a block diagram of a computer system in accordance with some embodiments.

FIG. 6 is a block diagram of a computer system 600 in accordance with some embodiments. The method 500 described with respect to FIG. 5 is realized in some embodiments by one or more computer systems 600 of FIG. 6. The system 600 comprises at least one processor 601, a memory 602, a network interface (I/F) 606, a storage 610, an input/output (I/O) device 608, and one or more hardware components 618 communicatively coupled via a bus 604 or other interconnection communication mechanism.

The memory 602 comprises, in some embodiments, a random access memory (RAM) and/or other dynamic storage device and/or read only memory (ROM) and/or other static storage device, coupled to the bus 604 for storing data and/or instructions to be executed by the processor 601, e.g., kernel 614, user space 616, portions of the kernel and/or the user space, and components thereof. The memory 602 is also used, in some embodiments, for storing temporary variables or other intermediate information during execution of instructions to be executed by the processor 601.

In some embodiments, a storage device 610, such as a magnetic disk or optical disk, is coupled to the bus 604 for storing data and/or instructions, e.g., kernel 614, user space 616, etc. The I/O device 608 comprises an input device, an output device and/or a combined input/output device for enabling user interaction with the system 600. An input device comprises, for example, a keyboard, keypad, mouse, trackball, trackpad, and/or cursor direction keys for communicating information and commands to the processor 601. An output device comprises, for example, a display, a printer, a voice synthesizer, etc. for communicating information to a user.

In some embodiments, one or more operations and/or functionality described with respect to FIG. 5 are realized by the processor 601, which is programmed for performing such operations and/or functionality. One or more of the memory 602, the I/F 606, the storage 610, the I/O device 608, the hardware components 618, and the bus 604 is/are operable to receive instructions, data and/or other parameters for processing by the processor 601.

In some embodiments, one or more of the operations and/or functionality described with respect to FIG. 5 is/are implemented by specifically configured hardware (e.g., by one or more application specific integrated circuits or ASIC(s)) which is included separate from or in lieu of the processor 601. Some embodiments incorporate more than one of the described operations and/or functionality in a single ASIC.

In some embodiments, the operations and/or functionality are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

The above method embodiment shows example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing various embodiments.

According to some embodiments, a sensing amplifier for a memory device comprises first and second nodes, an input device and an output device. The memory device comprises first and second bit lines, and at least one memory cell coupled to the first and second bit lines. The first node is configured to be coupled to the first bit line. The second node is configured to be coupled to the second bit line. The input device is coupled to the first and second nodes and configured to generate a first current pulling the first node toward a predetermined voltage in response to a first datum read out from the memory cell, and generate a second current pulling the second node toward the predetermined voltage in response to a second datum read out from the memory cell. The output device is coupled to the first node, and configured to output the first or second datum read out from the memory cell. The first current is greater than the second current.

According to some embodiments, a memory device comprises at least one pair of bit lines including a first bit line and a second bit line, at least one memory cell coupled to the first and second bit lines, first through fourth transistors, and an output device. The first and third transistors are coupled in series between a power supply voltage node and a reference node. The second and fourth transistors are coupled in series between the power supply voltage node and the reference node. The first transistor is coupled to the third transistor at a first node. The first node is configured to be coupled to the first bit line. The first node is coupled to gates of the second and fourth transistors, and to the output device. The second transistor is coupled to the fourth transistor at a second node. The second node is configured to be coupled to the second bit line. The second node is coupled to gates of the first and third transistors. A ratio of a first drain current of the first transistor to a second drain current of the second transistor matches a ratio of a total capacitance loading of the first node to a total capacitance loading of the second node.

In some embodiments, a method of designing a memory device is performed by at least one processor. The method comprises determining a total capacitance loading of a first node and a total capacitance loading of a second node of an asymmetric sensing amplifier. The asymmetric sensing amplifier has complementary logic states at the first node and second node. The method further comprises configuring at least one of a first circuit or a second circuit of the asymmetric sensing amplifier based on a ratio of the determined total capacitance loading of the first node to the determined total capacitance loading of the second node. The first circuit is associated with the first node, and the second circuit is associated with the second node.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A sensing amplifier for a memory device, the memory device comprising first and second bit lines and at least one memory cell coupled to the first and second bit lines, the sensing amplifier comprising:
    a first node configured to be coupled to the first bit line;
    a second node configured to be coupled to the second bit line;
    an input device coupled to the first and second nodes, the input device configured to
        generate a first current pulling the first node toward a predetermined voltage in response to a first datum read out from the memory cell, and
        generate a second current pulling the second node toward the predetermined voltage in response to a second datum read out from the memory cell; and
    an output device coupled to the first node, the output device configured to output the first or second datum read out from the memory cell;
    wherein the first current is greater than the second current.

2. The sensing amplifier of claim 1, wherein the sensing amplifier is an asymmetric sensing amplifier which is free of a dummy output device and a dummy conductive pattern coupled to the second node.

3. The sensing amplifier of claim 1, wherein the sensing amplifier is an asymmetric sensing amplifier which is free of direct coupling between the output device and the second node.

4. The sensing amplifier of claim 1, wherein a total capacitance loading of the first node is greater than a total capacitance loading of the second node.

5. The sensing amplifier of claim 1, wherein the input device is configured to have a ratio of the first current to the second current matching a ratio of a total capacitance loading of the first node to a total capacitance loading of the second node.

6. The sensing amplifier of claim 1, wherein
    a first circuit of the input device comprises a first transistor defining the first current,
    a second circuit of the input device comprises a second transistor defining the second current, and
    a ratio of channel width to channel length of the first transistor is greater than that of the second transistor.

7. The sensing amplifier of claim 1, wherein
    a first circuit of the input device comprises a first transistor defining the first current,
    a second circuit of the input device comprises a second transistor defining the second current,
    the first transistor has a first ratio of channel width to channel length,
    the second transistor has a second a ratio of channel width to channel length, and
    a ratio of the first ratio to the second ratio matches a ratio of a total capacitance loading of the first node to a total capacitance loading of the second node.

8. A memory device, comprising:
    at least one pair of bit lines including a first bit line and a second bit line;
    at least one memory cell coupled to the first and second bit lines;
    first through fourth transistors; and
    an output device;
wherein
    the first and third transistors are coupled in series between a power supply voltage node and a reference node,
    the second and fourth transistors are coupled in series between the power supply voltage node and the reference node,
    the first transistor is configured to have a first drain current when the first transistor is turned on and is coupled to the third transistor at a first node, the first node configured to be coupled to the first bit line,
    the first node is coupled to gates of the second and fourth transistors, and to the output device,
    the second transistor is configured to have a second drain current when the second transistor is turned on and is coupled to the fourth transistor at a second node, the second node configured to be coupled to the second bit line, the first drain current and the second drain current having different current values,
    the second node is coupled to gates of the first and third transistors, and
    a ratio of the first drain current of the first transistor to the second drain current of the second transistor matches a ratio of a total capacitance loading of the first node to a total capacitance loading of the second node.

9. The memory device of claim 8, wherein
    the total capacitance loading of the first node comprises a sum of a parasitic capacitance of the at least one memory cell, parasitic capacitances of drains of the first and third transistors, parasitic capacitances of the gates of the second and fourth transistors, and a parasitic capacitance of the output device, and
    the total capacitance loading of the second node comprises a sum of a parasitic capacitance of the at least one memory cell, parasitic capacitances of drains of the second and fourth transistors, and parasitic capacitances of the gates of the first and third transistors.

10. The memory device of claim 8, further comprising:
    a fifth transistor commonly coupling the fifth and second transistors to the reference node.

11. The memory device of claim 8, further comprising:
    a pair of data lines including a first data line and a second data line, the first data line coupled to the first node, and the second data line coupled to the second node; and
    at least one pair of switches including a first switch and a second switch, the first switch coupled between the first data line and the first bit line, the second switch coupled between the second data line and the second bit line, the first and second switches configured to be turned ON or OFF by a common column select signal.

12. The memory device of claim 11, wherein
    the at least one memory cell comprises a plurality of memory cells coupled to the first and second bit lines,
    the total capacitance loading of the first node comprises a sum of parasitic capacitances of the plurality of memory cells, parasitic capacitances of drains of the first and third transistors, parasitic capacitances of the gates of the second and fourth transistors, and a parasitic capacitance of the output device, and
    the total capacitance loading of the second node comprises a sum of parasitic capacitances of the plurality of memory cells, parasitic capacitances of drains of the second and fourth transistors, and parasitic capacitances of the gates of the first and third transistors.

13. The memory device of claim 11, wherein
the at least one memory cell comprises a plurality of memory cells,
the at least one pair of bit lines comprises a plurality of pairs of bit lines, each of the plurality of pairs of bit lines coupled to multiple memory cells among the plurality of memory cells, and
the at least one pair of switches comprises a plurality of pairs of switches, each of the plurality of pairs of switches coupled between the pair of data lines and a corresponding one of the plurality of pairs of bit lines.

14. The memory device of claim 8, wherein
the first and second transistors are n-channel metal-oxide semiconductor (NMOS) transistors, and
the third and fourth transistors are p-channel metal-oxide semiconductor (PMOS) transistors.

15. The memory device of claim 14, wherein
the first transistor has a first ratio of channel width to channel length,
the second transistor has a second a ratio of channel width to channel length, and
a ratio of the first ratio to the second ratio matches a ratio of a total capacitance loading of the first node to a total capacitance loading of the second node.

16. The memory device of claim 8, wherein the memory device is free of a dummy output device and a dummy conductive pattern coupled to the second node.

17. The memory device of claim 16, wherein the memory device is free of direct coupling between the output device and the second node.

18. A method of designing a memory device, the method performed by at least one processor and comprising:
determining a total capacitance loading of a first node of an asymmetric sensing amplifier;
determining a total capacitance loading of a second node of the asymmetric sensing amplifier, the asymmetric sensing amplifier having complementary logic states at the first node and second node; and
configuring at least one of a first circuit or a second circuit of the asymmetric sensing amplifier based on a ratio of the determined total capacitance loading of the first node to the determined total capacitance loading of the second node, the first circuit associated with the first node, the second circuit associated with the second node.

19. The method of claim 18, wherein the memory device comprises first and second bit lines, at least one memory cell coupled to the first and second bit lines, and the asymmetric sensing amplifier,
the first node configured to be coupled to the first bit line,
the second node configured to be coupled to the second bit line,
the first circuit configured to pull the first node toward a predetermined voltage in response to a first datum read out from the memory cell,
the second circuit configured to pull the second node toward the predetermined voltage in response to a second datum read out from the memory cell, and
the asymmetric sensing amplifier further comprising an output device coupled to the first node, the output device configured to output the first or second datum read out from the memory cell.

20. The method of claim 19, wherein the total capacitance loading of the first node comprises a parasitic capacitance of the output device, whereas the total capacitance loading of the second node does not comprise the parasitic capacitance of the output device.

* * * * *